United States Patent [19]

Anagnostopoulos et al.

[11] 4,371,890
[45] Feb. 1, 1983

[54] TAPERING OF OXIDIZED POLYSILICON ELECTRODES

[75] Inventors: Constantine N. Anagnostopoulos, Mendon; Deepak K. Ranadive, Webster, both of N.Y.

[73] Assignee: Eastman Kodak Company, Rochester, N.Y.

[21] Appl. No.: 201,957

[22] Filed: Oct. 29, 1980

[51] Int. Cl.³ .............................................. H01L 29/04
[52] U.S. Cl. ...................................... 357/59; 357/68; 357/30
[58] Field of Search .............. 357/59, 23 R, 68, 23 S, 357/30

[56] References Cited

U.S. PATENT DOCUMENTS

| | | | |
|---|---|---|---|
| 3,769,109 | 10/1973 | MacRae et al. | 156/3 |
| 3,909,325 | 9/1975 | Church et al. | 156/17 |
| 4,026,733 | 5/1977 | Owen et al. | 148/1.5 |
| 4,057,895 | 11/1977 | Ghezzo | 29/591 |
| 4,090,915 | 5/1978 | Keller | 156/628 |
| 4,142,925 | 3/1979 | King et al. | 148/175 |
| 4,187,125 | 2/1980 | Feist | 148/1.5 |
| 4,240,195 | 12/1980 | Clemens | 357/23 S |
| 4,302,766 | 11/1981 | Guterman | 357/59 X |

OTHER PUBLICATIONS

T. Yanagawa et al, IEEE Transactions on Electron Devices, "Failure Analysis of Evaporated Metal Interconnections at Contact Windows", pp. 964-970, vol. Ed-17, No. 11 Nov. 1970.

M. Hutt et al, Solid State Technology, "Optimization and Specification of Dry Etching Processes", pp. 92-97, Mar. 1980.

W. E. Armstrong et al, J. Electrochem. Soc.: Solid-State Science and Technology, "A Scanning Electron Microscope Investigation of Glass Flow in MOS Integrated Circuit Fabrication", pp. 307-310, vol. 121, No. 2, Feb. 1974.

Research Disclosure Pub. No. 16130, vol. 161, Sep. 1977 published by Industrial Opportunities Ltd., Homewell, Havant, Hampshire, P09 1EF UK.

W. G. Oldham et al, "The Oxidation of Polysilicon," Electrochem. Soc. Meeting, Abstract No. 165, Boston, Mass., Spring 1979.

*Primary Examiner*—Martin H. Edlow
*Attorney, Agent, or Firm*—Thomas H. Close

[57] ABSTRACT

A technique for fabricating an oxidized polysilicon electrode structure is disclosed that results in a gently tapered profile at electrode step regions, thereby facilitating the formation of an overlying electrode structure free from physical defects.

8 Claims, 16 Drawing Figures

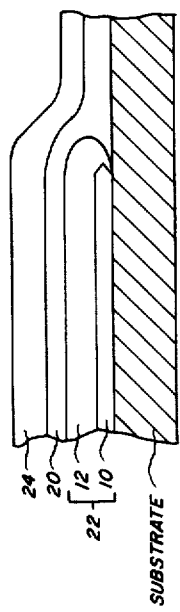
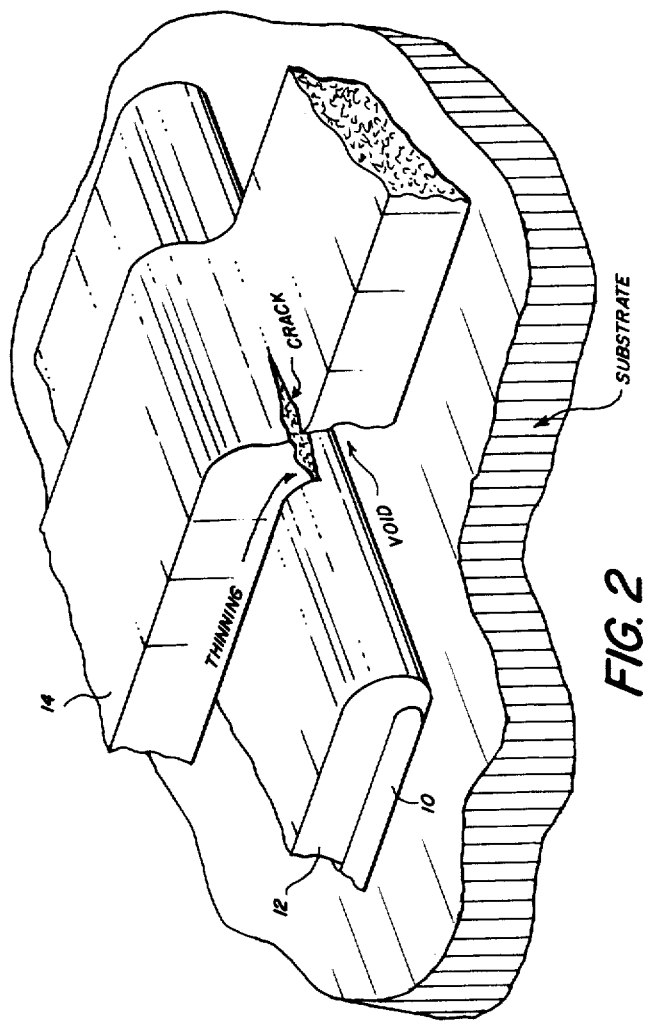

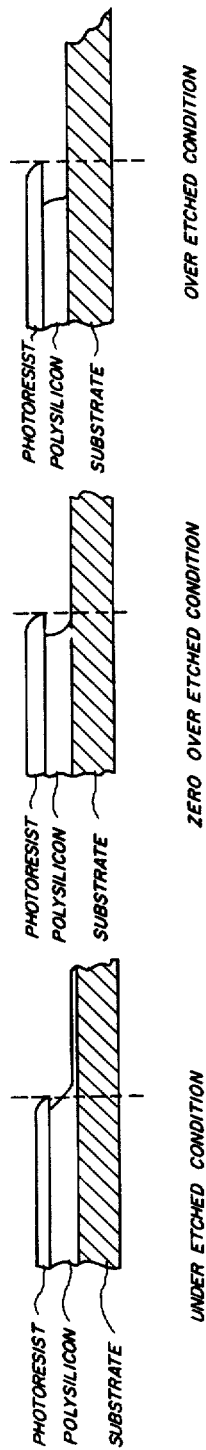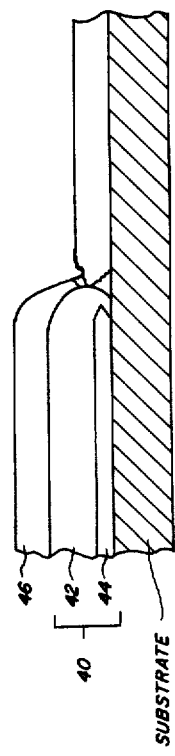

TAPERING OF OXIDIZED POLYSILICON ELECTRODES

FIELD OF THE INVENTION

The present invention relates to the formation of, and articles having, an oxidized polysilicon electrode that has a tapered edge profile.

DESCRIPTION RELATIVE TO THE PRIOR ART

In the manufacture of integrated circuit devices such as area image sensors and memory arrays which have two or more levels of electrodes, it is common practice to fabricate the first level electrodes (i.e., those electrodes which are formed first) from polycrystalline silicon (hereinafter referred to as polysilicon). Polysilicon is a preferred material for first level electrodes because it is easily oxidized to form an insulating layer between it and higher level electrodes. On the other hand, the edges of the oxidized polysilicon electrodes form abrupt steps which make it extremely difficult to form an overlying structure. Specifically, in a region where an overlying electrode structure crosses an abrupt step of a polysilicon electrode, physical defects are observed which include cracks in the overlying electrode structure, voids under the overlying electrode structure, and a thinning of the overlying electrode structure in the vicinity of the step. The voids are particularly troublesome because they allow etchant used in subsequent processing steps to attack the overlying electrode structure from its underside, oftentimes eating through the metal to such an extent that a complete break in the electrode occurs. Such defects not only physically weaken the overlying electrode structure, but also affect its electrical properties by effectively reducing its cross-sectional area, thereby increasing the electrode's electrical resistance.

It is common practice to avoid such defects by depositing a glass material such as phosphorous doped silox (silicon dioxide) on a device after the oxidized polysilicon electrodes have been formed, but before fabrication of the overlying electrode structure. The glass material is then heated to the point where it flows, thereby forming a layer of glass that smoothes out the abrupt step formed by the polysilicon electrodes. See, for example, W. E. Armstrong and D. L. Tolliver, "A Scanning Electron Microscope Investigation of Glass Flow in MOS Integrated Circuit Fabrication," Journal of the Electrochemical Society, Vol. 121, pp. 307-310, February, 1974. In some applications, however, this method cannot be used because the additional glass layer which results—and which affects certain electrical properties of the device—is incompatible with the device design. An example of such a device is the area image sensor disclosed in U.S. patent application Ser. No. 112,482, filed Jan. 16, 1980 in the names of T. H. Lee and R. P. Khosla. While it has been found to be possible to fabricate the area image sensor disclosed in U.S. patent application Ser. No. 112,482 even though the oxidized polysilicon electrodes have abrupt steps, the fabrication process tends to be unpredictable and the yield is quite low. In such an instance, it would seem logical to attempt to improve the fabrication process by providing tapered edge profiles directly to the oxidized polysilicon electrodes in order to eliminate the abrupt steps that would otherwise occur. If this approach were successful, a glass smoothing layer would not be required.

A method for producing polysilicon electrodes having tapered profiles is disclosed in U.S. Pat. No. 4,057,895 wherein boron is diffused (before electrode formation) into a polysilicon layer through a mask that defines the electrodes to be formed. Because the diffusivity of boron varies inversely with respect to the distance of the polysilicon material from the surface of the substrate, the boron dopant assumes a tapered profile within the layer of polysilicon. Those regions of polysilicon not having a boron dopant are then etched away by a preferential etching process, leaving a polysilicon electrode that has the same tapered profile as the boron dopant. A significant drawback of this method, however, is that the etching procedure used is not one that is routinely used in the fabrication of integrated circuits. As a result, the practice of this method introduces additional complexity and unpredictability to the integrated circuit fabrication process.

SUMMARY OF THE INVENTION

In accordance with the present invention, an oxidized polysilicon electrode structure is so formed that its edge regions present a gently tapered profile to an overlying electrode structure without the need for unconventional process steps or a glass smoothing layer. In a presently preferred embodiment, a uniformly thick layer of polysilicon is isotropically etched to a generally zero over etched condition (defined below) to form a polysilicon electrode structure. A layer of polysilicon dioxide having a thickness $t_o$ is then formed on the polysilicon electrode structure such that $t_o$ is less than or equal to 1.5 $t_{ps}$, where $t_{ps}$ is the thickness of the polysilicon electrode structure remaining after polysilicon dioxide formation. The result is an oxidized polysilicon electrode structure free from abrupt steps.

BRIEF DESCRIPTION OF THE DRAWINGS

In the detailed description of the preferred embodiments of the invention presented below, reference is made to the accompanying drawings, in which:

FIG. 2 is a perspective view of a portion of an integrated circuit device that illustrates the physical damage that commonly occurs in regions where an overlying electrode structure crosses the step region of an oxidized polysilicon electrode;

FIG. 3 is a sectional view of an integrated circuit device showing a prior art solution to the problem illustrated in FIG. 2;

FIGS. 4a, 4b and 4c are sectional views that illustrate various etch conditions that are useful in explaining one aspect of the present invention;

FIG. 5 shows the effect of forming a thick layer of silicon dioxide on a polysilicon electrode that has been etched to the condition shown in FIG. 4b;

DETAILED DESCRIPTION OF THE PREFERRED EMBODIMENTS

Figure 1:
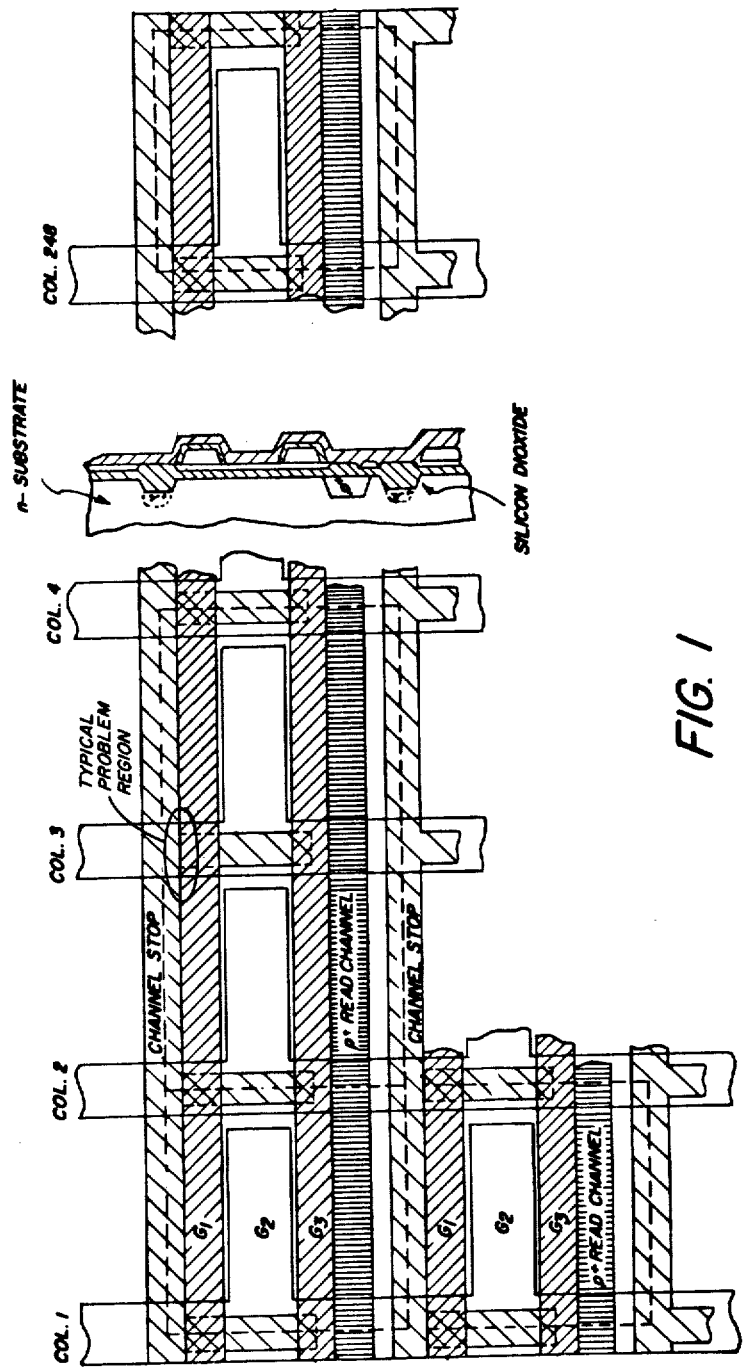
FIG. 1 is a diagram showing the construction of an area image sensor disclosed in U.S. patent application Ser. No. 112,482.

FIG. 1 shows a portion of the electrode structure of the area image sensor disclosed in U.S. patent application Ser. No. 112,482, referred to above. Only those aspects of the area image sensor that are relevant to the present invention are discussed below, the reader being referred to the above-referenced patent application for a detailed discussion of sensor operation. Basically the sensor is comprised of an array of photosites arranged in rows and columns on a semiconductor substrate, shown as being n-type in FIG. 1. An enable gate structure $G_1$ is comprised of an oxidized polysilicon electrode in the form of a strip that extends the length of a photosite row. The enable gate structure $G_1$ is crossed by each of a plurality of address gate structures $G_2$ which are formed of a conductive material such as aluminum. An isolating gate structure $G_3$, also comprised of an electrically conductive material, extends the length of the photosite row and is disposed substantially parallel to the enable gate structure $G_1$. A p+ read channel having a conductivity type different from that of the substrate is proximately disposed to the isolating gate structure $G_3$.

Scanning electron micrography of the area image sensor shown in FIG. 1 has revealed various physical defects in those regions where the overlying address gate structure $G_2$ crosses the step formed by each edge of the underlying polysilicon enable gate structure $G_1$. (See "Typical Problem Region" of FIG. 1.) Such a defect region is qualitatively illustrated in FIG. 2. An oxidized polysilicon electrode structure comprised of a polysilicon electrode 10 and a silicon dioxide ($SiO_2$) layer 12 grown thereover forms an abrupt step region. As a result, a subsequently formed overlying electrode structure 14 is subject to several types of physical defects: (1) Cracks often occur which can be so severe as to cause complete breaks in the overlying electrode structure 14. (2) Voids occur beneath the overlying electrode structure 14 which physically damage the electrode structure and permit etchant from subsequent processing steps to attack the overlying electrode structure from its underside. (3) A thinning of the overlying electrode structure 14 occurs as the electrode 14 crosses the step region of the underlying oxidized polysilicon electrode. These physical defects, even if not so severe as to render the device totally inoperable, cause the device to be extremely fragile and susceptible to damage during dicing and bonding operations. Cracks, voids and thinning, apart from physically damaging the overlying electrode structure 14, have the effect of reducing the effective cross-sectional area of the electrode, thereby increasing the electrode's electrical resistance and susceptibility to electron migration.

The physical defects described above (cracks, voids, and thinning) are most severe when the overlying electrode structure is formed by an evaporation technique, i.e., electrode material is heated to the point where it is "evaporated" onto the target. But while other more expensive and complex techniques such as chemical vapor deposition are less susceptible to such physical defects, abrupt steps in the polysilicon electrode(s) cause abrupt steps to be formed in any additional overlying electrode structure as well. And these abrupt steps in the overlying electrode structure create problems in subsequent process steps.

The most common solution to the step coverage problem is a glass flowing technique (described above) which eliminates the abrupt step formed by the oxidized polysilicon electrode structure and replaces it with a tapered layer of glass. FIG. 3 shows a cross-sectional view of a step region of a device formed in this manner. Because a flowed glass layer 20 forms a gently tapered surface over the abrupt step formed by an oxidized polysilicon electrode 22, an overlying electrode structure 24 is easily formed that is free from the physical defects described above. This glass flowing technique, however, cannot be used with all integrated circuit devices. In certain devices, for example, the overlying electrode structure must be formed directly over the substrate; therefore, an intervening layer of glass cannot be tolerated. This is frequently the case in devices, such as the area image sensor shown in FIG. 1, wherein the overlying electrode structure is used to produce potential wells in the substrate. Aside from the above, formation of the glass layer requires an additional process sequence in the already complicated device fabrication process, and thus should be avoided if at all possible.

An alternative approach, discussed above, involves the diffusion of a boron dopant into the polysilicon layer before electrode formation. A preferential etching process is then used to produce polysilicon electrodes having tapered profiles. This method, however, requires an additional boron diffusion step as well as the use of an unconventional etching process.

The present invention provides an oxidized polysilicon electrode structure that is formed so that each step region presents a gently tapered profile to an overlying electrode structure without the need for a glass layer or unconventional process steps. In illustrating the formation of an oxidized polysilicon electrode structure in accordance with the present invention, it will be assumed that device fabrication begins with a wafer comprised of a layer of phosphorous doped polysilicon having uniform thickness on a substrate. Standard photolithographic techniques are used to form a photoresist mask over the layer of polysilicon which defines the polysilicon electrode to be formed.

In accordance with the invention, the layer of polysilicon is first isotropically etched (i.e., the etching process is non-preferential with respect to direction) through the mask to a generally "zero over etched" condition. The concept of isotropically etching to a "zero over etched" condition is illustrated in FIGS. 4a, 4b and 4c. In general, the polysilicon layer can be "under etched", etched to a "zero over etched" condition, or "over etched", depending on the degree of etching that is allowed to take place. FIG. 4a shows a polysilicon electrode structure formed by under etching. As shown in FIG. 4a, in an under etched condition the etching process does not completely remove the polysilicon in the area exposed by the photoresist mask. Etching for a longer time (or at a higher temperature, etc.) produces a condition known as "zero over etched", which is shown in FIG. 4b. In this case the polysilicon is completely removed only in the area exposed by the photoresist mask. Importantly, the profile of the polysilicon step is gently tapered, approximating a circular arc. This circular taper is the result of using an isotropic etching process, as well as etching to a zero over etched condition. Further etching results in an over etched condition, shown in FIG. 4c, wherein the polysilicon has been completely removed from the exposed area as well as from an area beneath the photoresist mask. It will also be noted that the step of the polysilicon has a steep slope.

Isotropically etching doped polysilicon to a generally zero over etched condition, therefore, results in a polysilicon electrode structure wherein the step region has a gently tapered profile approximating that of a circular arc. Even so, zero over etching alone does not ensure that there will be no problems in step coverage. This is because the overlying electrode structure is not formed directly on the polysilicon electrode structure. Instead, the polysilicon electrode is first insulated by an oxidation process wherein a layer of silicon dioxide is grown thereon to form an oxidized polysilicon electrode structure. It is this oxidized polysilicon electrode structure which forms the base for the overlying electrode structure.

Unfortunately, the silicon dioxide formation step degrades the profile of the step region to such an extent that even though the polysilicon electrode structure (before oxidation) possesses a gentle taper, the resulting oxidized polysilicon electrode may have an abrupt step which results in the step coverage defects discussed above (i.e., cracks, voids and thinning). This is illustrated in FIG. 5 which shows the result of growing a layer of silicon dioxide 42 over a polysilicon electrode structure 44 that originally had been isotropically etched to a generally zero over etched condition. (The condition shown in FIG. 4b). As is seen from FIG. 5, the final profile of the oxidized polysilicon electrode structure 40 is that of an abrupt step rather than the gentle taper originally possessed by the polysilicon electrode structure before oxidation. As a result, formation of an overlying electrode structure 46 results in the physical defects discussed above. It should be noted that the layer of silicon dioxide 42 not only possesses a steep slope, but has a region of inward curvature (i.e., curvature toward the polysilicon electrode 44 remaining after oxidation) near the substrate. It is this region of inward curvature that promotes the formation of voids beneath the overlying electrode structure.

Figure 6A:
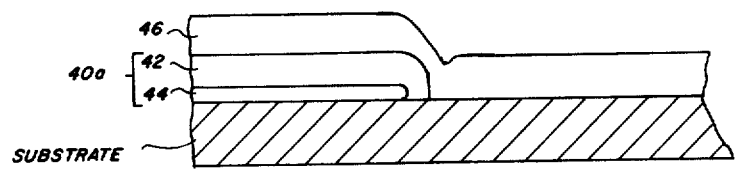
FIGS. 6a, 6b, and 6c illustrate the effect that the ratio of silicon dioxide thickness-to-polysilicon thickness has on an overlying electrode.
Figure 6B:
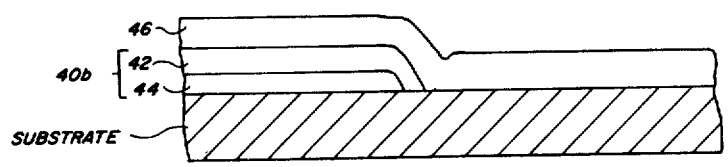
Figure 6C:
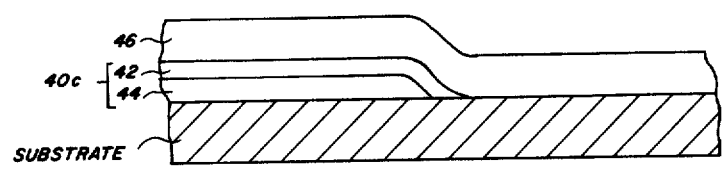

The present invention recognizes, however, that the gentle taper produced by isotropically etching a polysilicon electrode to generally a zero over etched condition is destroyed only when the layer of silicon dioxide grown thereover exceeds a certain thickness relative to the layer of polysilicon remaining after silicon dioxide formation. FIGS. 6a, 6b and 6c illustrate this concept. FIG. 6a shows the effect of growing less silicon dioxide on the polysilicon electrode structure than that illustrated in FIG. 5. It is seen that the step of the oxidized polysilicon electrode structure 40a is still steep, but not as steep as the electrode structure 40 shown in FIG. 5. Also, the region of inward curvature possessed by the electrode structure 40 is no longer present. As a result, while some physical defects can still be expected to occur (mainly thinning), such defects are less severe than those which occur in the case illustrated in FIG. 5. Reducing the thickness of the silicon dioxide layer even further results in the device structure shown in FIG. 6b wherein the oxidized polysilicon electrode structure 40b has a tapered profile which is sufficiently gentle to allow adequate step coverage of the overlying electrode structure 46. Even further reducing the thickness of the silicon dioxide layer produces an oxidized polysilicon electrode structure 40c having the gently tapered profile shown in FIG. 6c. In this case, step coverage, even by an evaporation process, presents no problems.

To determine the maximum thickness of silicon dioxide which can be grown on a polysilicon electrode structure which has been isotropically etched to a generally zero over etched condition and still permit adequate step coverage, it is necessary to define what is meant by the term adequate step coverage. For purposes of this specification, the term adequate step coverage means that cracks and voids do not generally occur, and that the thinnest portion of the overlying electrode structure in the step region does not fall below about 25 percent of its nominal thickness in the region proximate the step region. Based on this definition of adequate step coverage, the following experimental results were obtained and are listed in the Table:

TABLE

| SiO$_2$ Layer Thickness (in microns) | Polysilicon Layer Thickness After SiO$_2$ Formation (in microns) | Thickness Ratio (SiO$_2$/Polysilicon) | Adequate Step Coverage |
|---|---|---|---|
| 1.70 | 3.60 | 0.50 | Yes |
| 0.78 | 1.00 | 0.78 | Yes |
| 0.65 | 0.80 | 0.81 | Yes |
| 0.53 | 0.60 | 0.89 | Yes |
| 0.60 | 0.65 | 0.92 | Yes |
| 0.27 | 0.27 | 1.00 | Yes |
| 0.32 | 0.23 | 1.40 | Yes |
| 0.60 | 0.40 | 1.50 | Yes |
| 0.75 | 0.35 | 2.14 | No |
| 0.64 | 0.27 | 2.33 | No |
| 0.83 | 0.33 | 2.50 | No |
| 0.50 | 0.15 | 3.33 | No |
| 0.75 | 0.20 | 3.75 | No |
| 0.68 | 0.14 | 5.00 | No |

The examples given in the Table indicate that adequate step coverage results so long as the ratio of the thickness of the silicon dioxide layer to the thickness of the polysilicon layer remaining after oxidation is less than about 1.5. Above a ratio of about 1.5, the step becomes too abrupt and physical defects result. The present invention teaches, therefore, that, in forming an oxidized polysilicon electrode structure free from abrupt steps, a thick layer of silicon dioxide cannot be grown on a thin layer of polysilicon.

It will be apparent to those skilled in the art that any etching process which results in an electrode profile that has a taper greater than or equal to the circular taper described above (i.e., the tapered profile is less steep than a circular taper) can be used to form the polysilicon electrode. In such case, the resulting oxidized polysilicon electrode will have the desired gentle taper which facilitates formation of an overlying electrode structure.

Figure 7A:
FIGS. 7a through 7f show various stages of the fabrication of an integrated circuit device in accordance with the present invention.
Figure 7B:
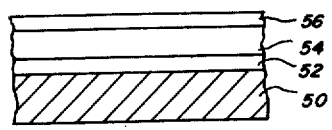
Figure 7C:
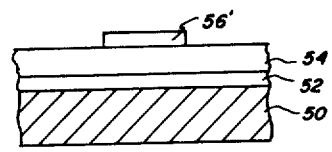
Figure 7D:
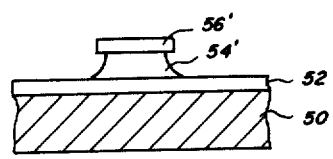
Figure 7E:
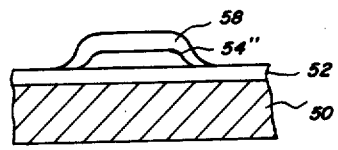
Figure 7F:
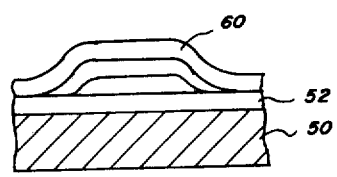

As a specific example in accordance with the present invention of the fabrication of the step region denoted as a "typical problem region" in FIG. 1, reference is made to FIGS. 7a through 7f. A substrate 50 having an insulating layer 52 of silicon dioxide is coated with a one micron thick layer 54 of polysilicon by a low pressure chemical vapor deposition process (FIG. 7a). The polysilicon is then doped with phosphorous from a POCl$_3$ (phosphorous oxychloride) source to produce n-type polysilicon. The polysilicon layer 54 is deglazed in a 10:1 aqueous hydrofluoric acid (HF) bath for about 10 seconds to remove any phosphorous pentoxide (PO$_5$) which may have formed on the surface of the polysilicon. The polysilicon surface is then rinsed in water and dried in a nitrogen (N$_2$) atmosphere at a temperature of 450° C. for about 30 minutes. A layer 56 of a positive photoresist is then coated over the polysilicon layer (FIG. 7b). A pattern is formed in the photoresist layer 56 by standard photolithographic techniques to produce a mask 56' which defines the electrode structure to be formed from the polysilicon layer 54 (FIG. 7c).

The masked polysilicon layer 54 is then subjected to an isotropic plasma etching process in a barrel-type plasma reactor. The etchant is a mixture of carbon tetrafluoride (CF$_4$) and Oxygen (O$_2$). The etchant process parameters (time and temperature) are so controlled that the polysilicon layer 54 is etched to generally a zero over etched condition (FIG. 7d) to form a polysilicon electrode 54'. The photoresist mask is then removed, leaving a polysilicon electrode 54' that has a gently tapered profile at its step regions and is thus free from abrupt steps.

A layer 58 (FIG. 7e) of silicon dioxide is formed over the polysilicon electrode by a wet oxidation process wherein the polysilicon is heated to 950° C. in an environment containing water (H$_2$O) vapor. The duration of the oxidation process is controlled to produce an polysilicon dioxide layer (58) thickness of about 0.7 microns. The polysilicon electrode (54") which remains after polysilicon dioxide formation is about 0.6 microns in thickness.

The above-described process produces a gently tapered oxidized polysilicon electrode (which represents the enable gate structure G$_1$ shown in FIG. 1) that is ready for the formation of an overlying electrode structure (i.e., the address gate structure G$_2$ shown in FIG. 1). To form the overlying electrode structure, a mask (not shown) is formed by standard photolithographic techniques that defines the overlying electrode structure. A layer 60 of aluminum (Al) is evaporated through the mask onto the oxidized polysilicon electrode by an electron beam evaporation process (FIG. 7f) thereby forming an overlying electrode structure that is free from the physical defects discussed above.

The invention has been described in detail with particular reference to certain preferred embodiments thereof, but it will be understood that variations and modifications can be effected within the spirit and scope of the invention.

What is claimed is:

1. A thickly oxidized polysilicon electrode structure comprised of a doped polysilicon electrode structure and a layer of silicon dioxide grown from and overlying said polysilicon electrode structure, wherein (1) the thickness $t_o$ of the silicon dioxide layer is about 0.7 microns and the thickness of the underlying polysilicon is about 0.6 microns such that $t_o \leq 1.5 \, t_{ps}$, where $t_{ps}$ is the thickness of the underlying polysilicon, and (2) the profile of the thickly oxidized polysilicon electrode structure at an edge thereof is tapered so as not to have an inward curvature.

2. A structure as claimed in claim 1 further comprising an electrode structure overlying said thickly oxidized polysilicon electrode structure, said overlying electrode structure, in the region of a step, (1) being free from cracks and voids therebeneath, and (2) having a thickness which does not fall below about 25 percent of its nominal thickness in the region proximate the step region.

3. A structure as claimed in claim 2 wherein said overlying electrode structure is comprised of a metal that has been deposited by an evaporation process.

4. A structure as claimed in claim 3 wherein said overlying electrode structure is comprised of aluminum.

5. In apparatus for use in a photosensitive device comprising:

(a) a substrate structure comprised of a semiconductor material of one conductivity type having an overlying layer of insulating material;

(b) an enable gate structure comprised of a strip of electrically conductive material extending across a length of said substrate structure;

(c) an isolating gate structure comprised of a strip of electrically conductive material extending across a length of said substrate structure, said isolating gate structure being disposed substantially parallel to said enable gate structure;

(d) a plurality of overlying address gate structures each of which is comprised of a strip of electrically conductive material that extends over, but is electrically insulated from, said enable gate structure and said isolating gate structure, said enable gate structure and/or said address gate structure being transmissive to incident radiation so as to form a row of photosites; and (e) a read channel formed in said substrate structure comprised of a semiconductor material having a conductivity type opposite that of said substrate semiconductor material, said read channel being proximately disposed to said isolating gate structure, the improvement wherein at least one of said enable and isolating gate structures is comprised of a thickly oxidized polysilicon electrode structure, said thickly oxidized polysilicon electrode structure being comprised of a doped polysilicon electrode structure and a layer of silicon dioxide grown from and overlying said polysilicon electrode structure, wherein (1) the thickness $t_o$ of the silicon dioxide layer is about 0.7 microns and the thickness of the underlying polysilicon is about 0.6 microns such that $t_o \leq 1.5 \, t_{ps}$, where $t_{ps}$ is the thickness of the underlying polysilicon, and (2) the profile of the thickly oxidized polysilicon electrode structure at an edge thereof is tapered so as not to have an inward curvature.

6. Apparatus as claimed in claim 5 wherein said overlying address gate structure, in the region of a step of said oxidized polysilicon electrode structure, (1) is free from cracks and voids therebeneath, and (2) has a thickness which does not fall below about 25 percent of its nominal thickness in the region proximate the step region.

7. A structure as claimed in claim 5 wherein said overlying address gate structure is comprised of a metal that has been deposited by an evaporation process.

8. A structure as claimed in claim 7 wherein said overlying address gate structure is comprised of aluminum.

* * * * *